United States Patent
Arnborg

(10) Patent No.: US 7,786,720 B2
(45) Date of Patent: Aug. 31, 2010

(54) PASSIVE MIXER POWER DETECTOR METHOD AND APPARATUS

(75) Inventor: Torkel Arnborg, Stockholm (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 241 days.

(21) Appl. No.: 12/146,904

(22) Filed: Jun. 26, 2008

(65) Prior Publication Data

US 2009/0322312 A1 Dec. 31, 2009

(51) Int. Cl.
*G01R 19/22* (2006.01)
(52) U.S. Cl. .................................. 324/120; 324/123 R
(58) Field of Classification Search ........................ None
See application file for complete search history.

(56) References Cited

U.S. PATENT DOCUMENTS

| | | | |
|---|---|---|---|
| 4,307,347 A | 12/1981 | Thomson | |
| 4,319,196 A | 3/1982 | Kwan | |
| 4,584,532 A | 4/1986 | Duehren et al. | |
| 6,275,108 B1 | 8/2001 | Washburn | |
| 6,756,849 B2 * | 6/2004 | Dupuis et al. | 330/279 |
| 7,652,464 B2 * | 1/2010 | Lang et al. | 324/95 |
| 2006/0046674 A1 | 3/2006 | Vice | |

OTHER PUBLICATIONS

Enning, B. et al. "Signal Processing in an Optical Polarization Diversity Receiver for 560-Mbit/s ASK Heterodyne Detection." Journal of Lightwave Technology, vol. 7, No. 3, Mar. 1989, pp. 459-464.
Author Unknown. "Feedback." Newsletter of the Warminster Amateur Radio Club, Jun. 2002. Available at: http://www.k3dn.org/June%202002%20Feedback.pdf.
Huang, P.-C. et al. "A 2-V 107.-MHz CMOS Limiting Amplifier/RSSI." IEEE Journal of Solid-State Circuits, vol. 35, No. 10, Oct. 2000, pp. 1474-1480.
Jonsson, F. et al. "RF Detector for On-Chip Amplitude Measurements." Electronics Letters, vol, 40. No. 20, Sep. 30, 2004.
Kimura, K. "A CMOS Logarithmic IF Amplifier with Unbalanced Source-Coupled Pairs." IEEE Journal of Solid-State Circuits, vol. 28, No. 1, Jan. 1993, pp. 78-83.
Lee, T. H. The Design of CMOS Radio-Frequency Integrated Circuits. Cambridge University Press, Cambridge, United Kingdom, 1998, pp. 338-339.
Milanovic, V. et al. "CMOS Foundry Implementation of Schottky Diodes for RF Detection." IEEE Transactions on Electron Devices, vol. 43, No. 12, Dec. 1996, pp. 2210-2214.
Krekels et al., "Power Detector with GaAs Field Effect Transistors," 22nd European Microwave Conference, Sep. 5, 1992, pp. 174-179, IEEE, Piscataway, NJ, US.

* cited by examiner

*Primary Examiner*—Minh N Tang
(74) *Attorney, Agent, or Firm*—Coats & Bennett, P.L.L.C.

(57) ABSTRACT

The power level of an RF signal is detected using a circuit having relatively low DC offset, high dynamic range, small frequency and temperature dependence and low flicker noise. According to one embodiment, the power detector circuit comprises a chain of amplifiers and a passive mixer. The chain of amplifiers converts the RF input signal to a supply-limited RF square wave signal. The passive mixer passively mixes the supply-limited RF square wave signal with the RF input signal and in response generates a rectified output signal that tracks the amplitude of the RF input signal.

18 Claims, 8 Drawing Sheets

PASSIVE MIXER POWER DETECTOR METHOD AND APPARATUS

TECHNICAL FIELD

The present invention generally relates to power detectors, and more particularly relates to detecting power of a radio frequency (RF) signal.

BACKGROUND

Power detectors are used in radio applications for many different purposes. For example, an envelope detector can be used as a simple power meter showing transmitted output power, received signal strength and measured standing wave ratios in radios and service instruments. Envelope detectors typically include a diode and capacitor or a four diode ring rectifier. The diode included in an envelope detector is typically implemented as a junction diode (such as a Schottky diode) using standard CMOS process technology. However, junction diodes have a large forward voltage drop and poorly controlled operating parameters. A power detector can also be constructed from one or more transistors by operating each transistor in the non-linear region. For example, an unbalanced pair of CMOS transistor devices can be used for RMS-detection (Root Mean Square) by utilizing the quadratic operating characteristic of the transistors. RSSI (Receiver Signal Strength Indicator) detectors, often used in Bluetooth and WLAN can be combined with an unbalanced transistor pair and a saturated amplifier to increase dynamic range. For example, a softly saturated amplifier together with an unbalanced pair can be designed for small offset voltage.

Power detectors have specific requirements such as dynamic range, signal level, type of value detected (peak, RMS, etc.), frequency range and temperature dependence. Diode-capacitor and single transistor-capacitor power detectors have very small dynamic range, limiting their usefulness. Also, single transistor power detectors are extremely temperature sensitive. Unbalanced pair power detectors are less sensitive to temperature, but have a fundamental built in DC-offset voltage that limits dynamic range. Softly saturated amplifier-based power detectors have a broader dynamic range, but consume more area. Softly saturated amplifier-based power detectors also have a relatively small upper frequency limit. Thus, a power detector that has relatively low DC offset, high dynamic range, small frequency and temperature dependence and low flicker noise is highly desirable.

SUMMARY

According to the methods and apparatus taught herein, the power level of an RF signal is detected using a circuit having relatively low DC offset, high dynamic range, small frequency and temperature dependence and low flicker noise. The power detector circuit includes a chain of amplifiers for amplifying the RF signal and a passive mixer that functions as a rectifier. A sufficient number of amplifiers are included in the chain such that the RF signal is converted to a supply-limited RF square wave signal. Particularly, at least one of the amplifiers at the end of the chain operates in saturation for all non-negligible amplitude levels of the RF signal. Each amplifier in the chain that operates in saturation has an output that oscillates between the positive supply voltage and the negative supply voltage in square wave form for all non-negligible amplitude levels of the RF signal. The supply-limited square wave output of the amplifier chain is input to the passive mixer along with the original RF signal.

The supply-limited square wave input causes the passive mixer, which produces no flicker noise, to switch in a near-ideal manner. Switching the passive mixer in this way causes the mixer to output a rectified signal that tracks the amplitude of the RF signal. The mixer output can be filtered to remove non-zero frequencies, yielding a DC output voltage. The degree of phase difference between the signals input to the passive mixer is irrelevant so long as a 90° phase shift between the signals is avoided. The passive mixer output would be zero when the RF signal is non-zero if the 90° phase shift condition were to occur. In response, the passive mixer would stop tracking the slow varying DC amplitude of the RF signal. The time delay of the amplifier chain can be changed to avoid the 90° phase shift condition by adding additional amplifiers to the chain, shifting the total time delay of the chain away from the 90° phase condition.

According to one embodiment, the power detector comprises a chain of amplifiers and a passive mixer. The chain of amplifiers converts an RF input signal to a supply-limited RF square wave signal. The passive mixer passively mixes the supply-limited RF square wave signal with the RF input signal and in response generates a rectified output signal that tracks the amplitude of the RF input signal.

Of course, the present invention is not limited to the above features and advantages. Those skilled in the art will recognize additional features and advantages upon reading the following detailed description, and upon viewing the accompanying drawings.

DETAILED DESCRIPTION

Figure 1:
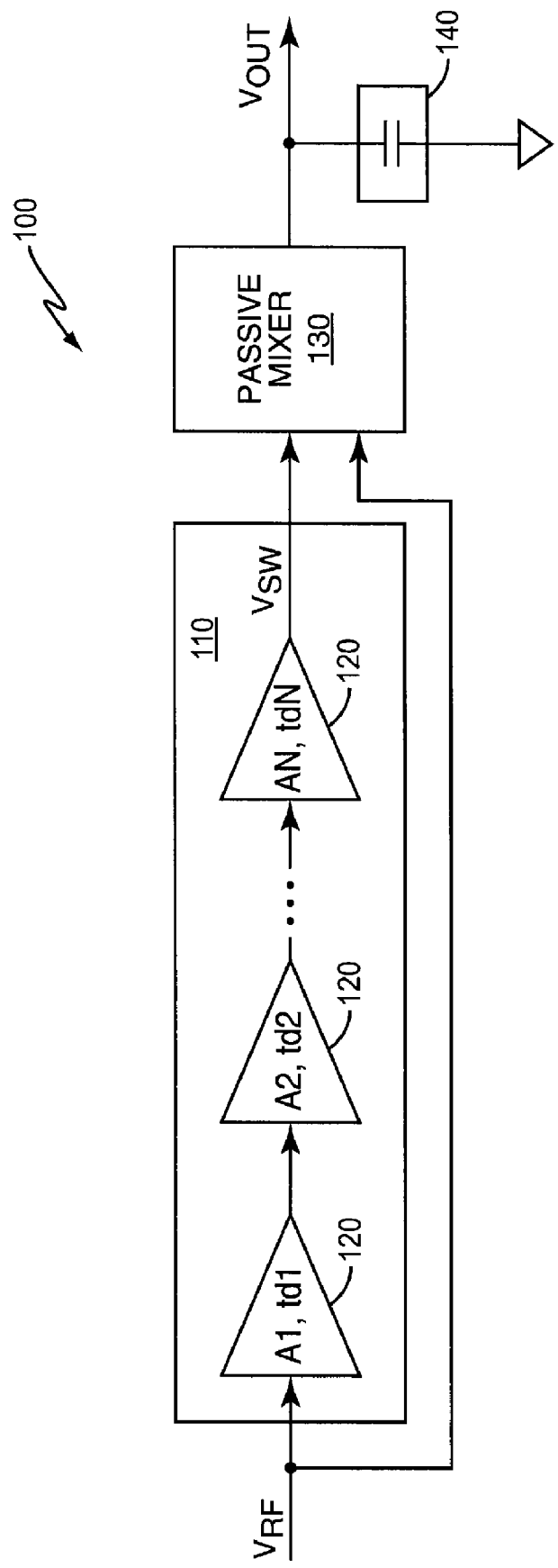
FIG. 1 is a block diagram of an embodiment of a power detector circuit including a chain of amplifiers and a passive mixer.

FIG. 1 illustrates an embodiment of a power detector circuit 100 including a chain 110 of amplifiers 120 and a passive mixer 130. The passive mixer 130 functions as a rectifier, outputting a rectified signal ($V_{OUT}$) that tracks the slow varying DC component of an RF signal ($V_{RF}$) input to the mixer 130. Switching of the passive mixer 130 is controlled by a supply-limited RF square wave signal ($V_{SW}$) input to the mixer 130. The signal that controls mixer switching is supply-limited in that the signal oscillates between a positive supply voltage and a negative supply voltage in square wave form for all non-negligible amplitude levels of the RF signal. The passive mixer 130 switches in a near-ideal manner in response to the supply-limited square wave signal, causing the mixer 130 to rectify the RF input signal. A filter 140 such as a capacitor can remove non-zero frequencies from the mixer output, yielding a DC output voltage that tracks the amplitude of the RF signal.

Figure 2:
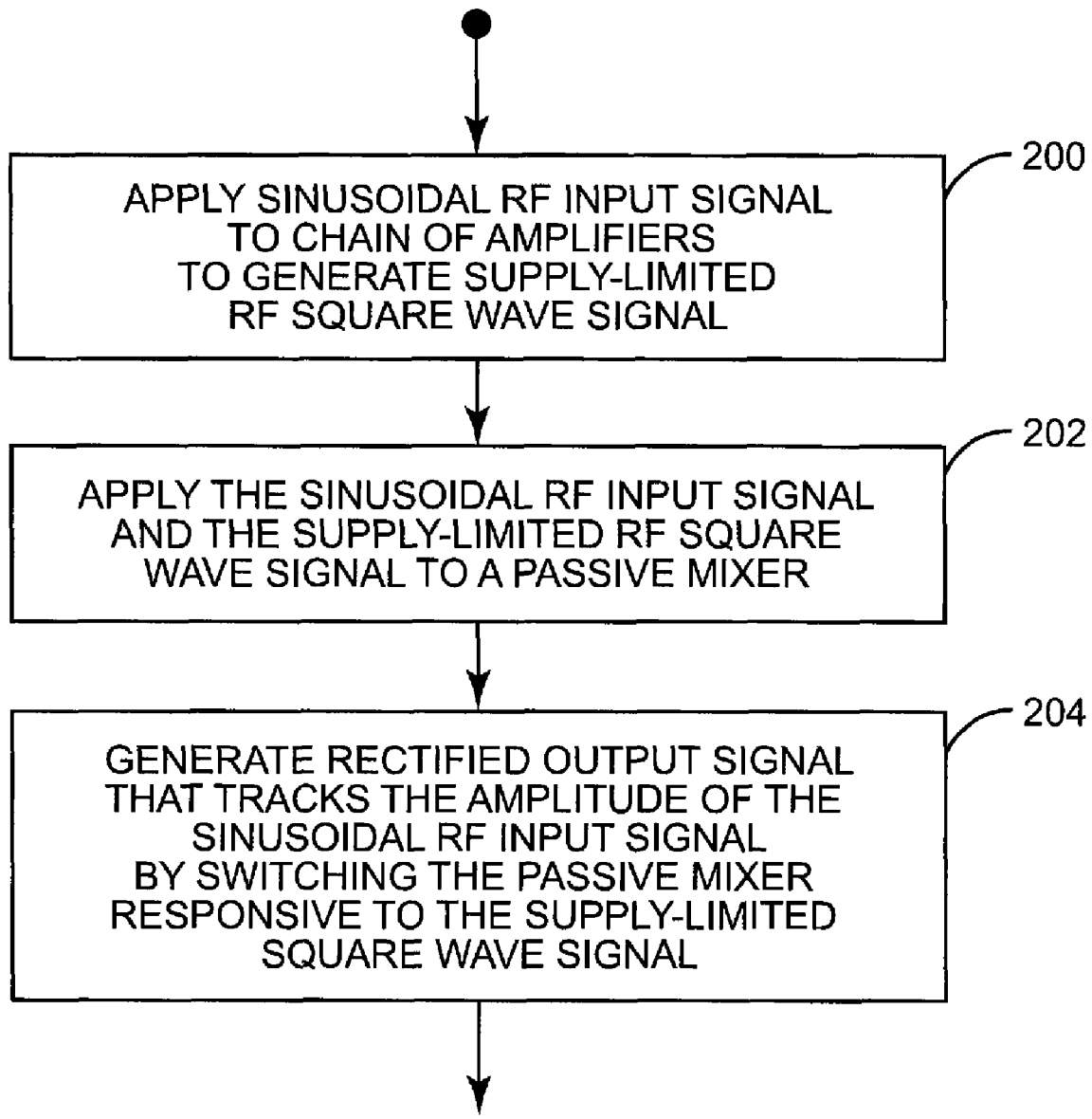
FIG. 2 is a flow diagram of an embodiment of program logic for detecting signal power of an RF input signal.

The supply-limited square wave signal is generated by applying the RF signal to the amplifier chain 110, e.g., as illustrated by Step 200 of FIG. 2. A sufficient number of amplifiers 120 are included in the chain 110 such that at least one of the amplifiers 120 at the end of the chain 110 operates in saturation for all amplitude levels of interest for the RF input signal. This way, the amplifier chain 110 converts the input signal to a supply-limited square wave signal. The output of the amplifier chain 110, along with the original input signal, are both input to the mixer 130, e.g., as illustrated by Step 202 of FIG. 2. The supply-limited square wave signal controls mixer switching, causing the mixer 130 to output a rectified signal that tracks the amplitude of the RF input signal, e.g., as illustrated by Step 204 of FIG. 2.

In one embodiment, the RF input signal is a sinusoidal signal having an RF carrier frequency $\omega_{RF}$ and slow varying amplitude $V_0(t)$ (also referred to as time varying DC component) and can be represented by:

$$V_{RF} = V_0(t)\cos(\omega_{RF}t) \quad (1)$$

The corresponding frequency domain representation is given by:

$$V_{RF} = Re[V_0 \exp(j\omega_{RF}t)] \quad (2)$$

The sinusoidal RF signal is input to the first amplifier 120 in the chain 110. The chain 110 has enough amplifiers 120 such that at least the last amplifier 120 in the chain 110 is saturated for the minimum input amplitude $V_0$. In one embodiment, at least some of the amplifiers 120 in the chain 110 are AC coupled to reduce DC-offset. The sinusoidal RF input signal enters the first amplifier 120 in the chain 110 as a sinusoid, but exits the last amplifier 120 in the chain 110 as a square wave due to supply level saturation that occurs later in the chain 110. The time delay at the end of the amplifier chain 110 relative to the time period can be represented by a phase shift. The phase shift $\Theta$ through the amplifier chain 110 is a function of the input signal amplitude and frequency as given by:

$$\Theta = \Theta(V_0, \omega_{RF}) \quad (3)$$

As a result, the rectified voltage ($V_{OUT}$) output by the detector 100 follows passive mixer theory as given by:

$$V_{OUT} = V_0(t)\cos(\Theta) \quad (4)$$

Thus, the output of the power detector 100 has a voltage level corresponding to the slow varying amplitude of the RF input signal and a frequency corresponding to the phase difference between the input signal and the amplifier chain output. In one embodiment, a square operation may be performed on the passive mixer output to detect actual power instead of voltage. Broadly, the dynamic range of the detector 100 is determined by the maximum difference in phase shift for the smallest and largest useful input signal levels at all frequencies of interest. The phase shift depends on both the CMOS technology employed to fabricate the power detector 100 and the frequency and amplitude of the RF input signal. In view of these variables, one or more additional amplifiers 120 can be added to the amplifier chain 110 for preventing the passive mixer output from having negligible amplitude when the RF input signal has non-negligible amplitude.

The passive mixer output is negligible when the RF input signal is non-negligible if a 90° phase difference exists between the two input signals to the passive mixer 130. If this condition occurs, the passive mixer 130 will not track the voltage amplitude of the RF input signal because of improper operation of the passive mixer 130. The 90° phase condition can be prevented by adding one or more extra amplifiers 120 to the chain 110, increasing the total time delay of the chain 110 and shifting the phase difference between the two input signals away from the 90° condition. In one embodiment, enough amplifiers 120 are added to the chain 110 such that the total phase shift between the two input signals is centered around 180° and also avoids the 90° phase condition for all non-negligible input signal levels and frequencies of interest.

Figure 3:
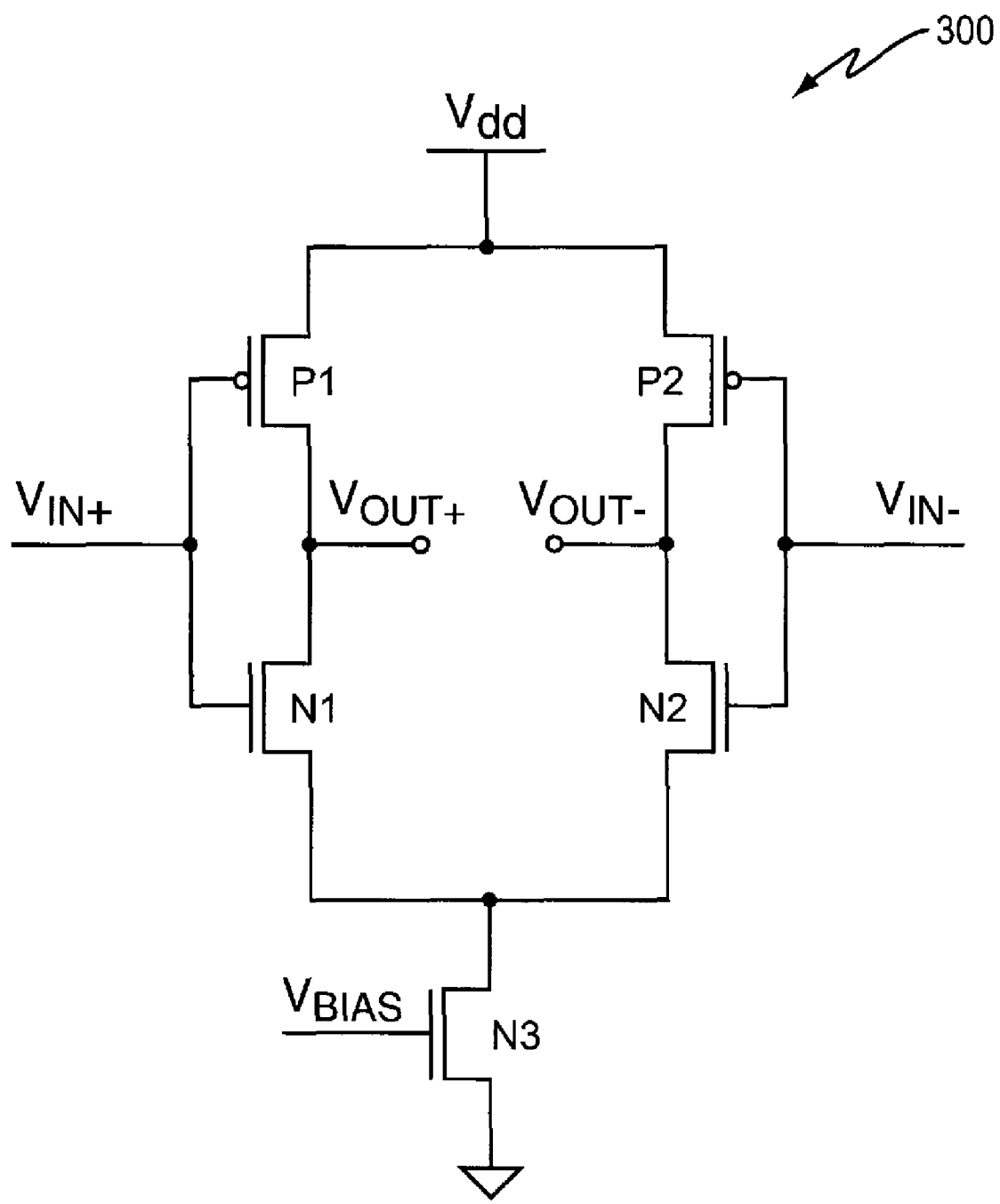
FIG. 3 is a block diagram of an embodiment of an inverting amplifier included in an amplifier chain of a power detector.

FIG. 3 illustrates an embodiment of the amplifier 120 as an inverting amplifier 300 included in the amplifier chain 110. The inverting amplifier 300 includes a pair of CMOS inverters P1/N1 and P2/N2 coupled between a power supply Vdd and a bias device N3 in a differential amplifier configuration. The pair of CMOS inverters P1/N1 and P2/N2 amplifies a differential input signal Vin+/Vin− and outputs an amplified differential signal Vout+Vout− to the next amplifier 120 in the chain 110. For the first inverting amplifier 300 in the chain 110, the differential input signal Vin+/Vin− is the RF signal ($V_{RF}$) input to the power detector 100 in differential form. For the last inverting amplifier 300 in the chain 110, the amplified differential signal Vout+/Vout− is the supply-limited RF square wave signal ($V_{SW}$) output to the passive mixer 130 in differential form.

Figure 4:
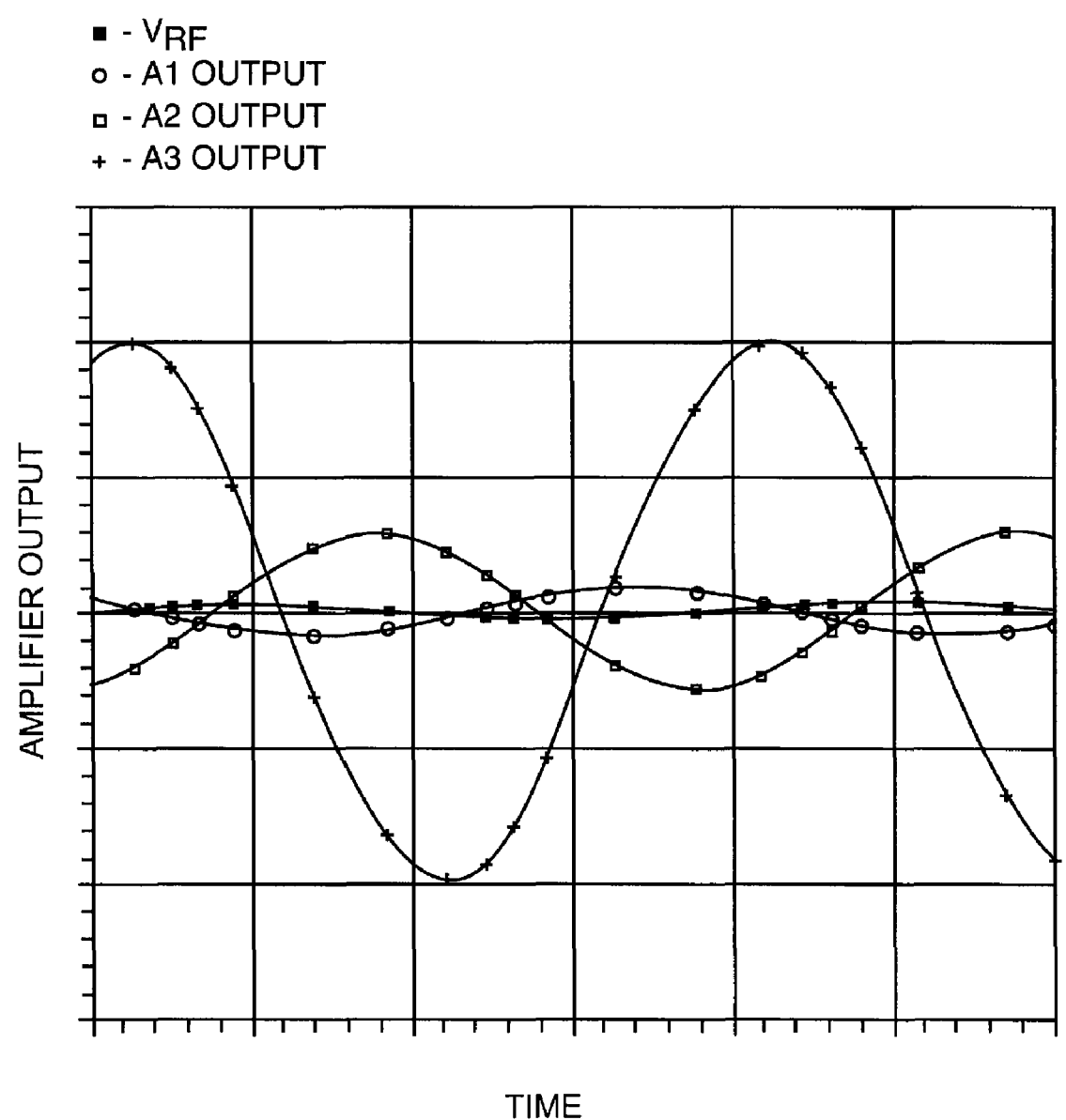
FIGS. 4 and 5 are plot diagrams showing the output of various amplifier stages included in an amplifier chain of a power detector.
Figure 5:
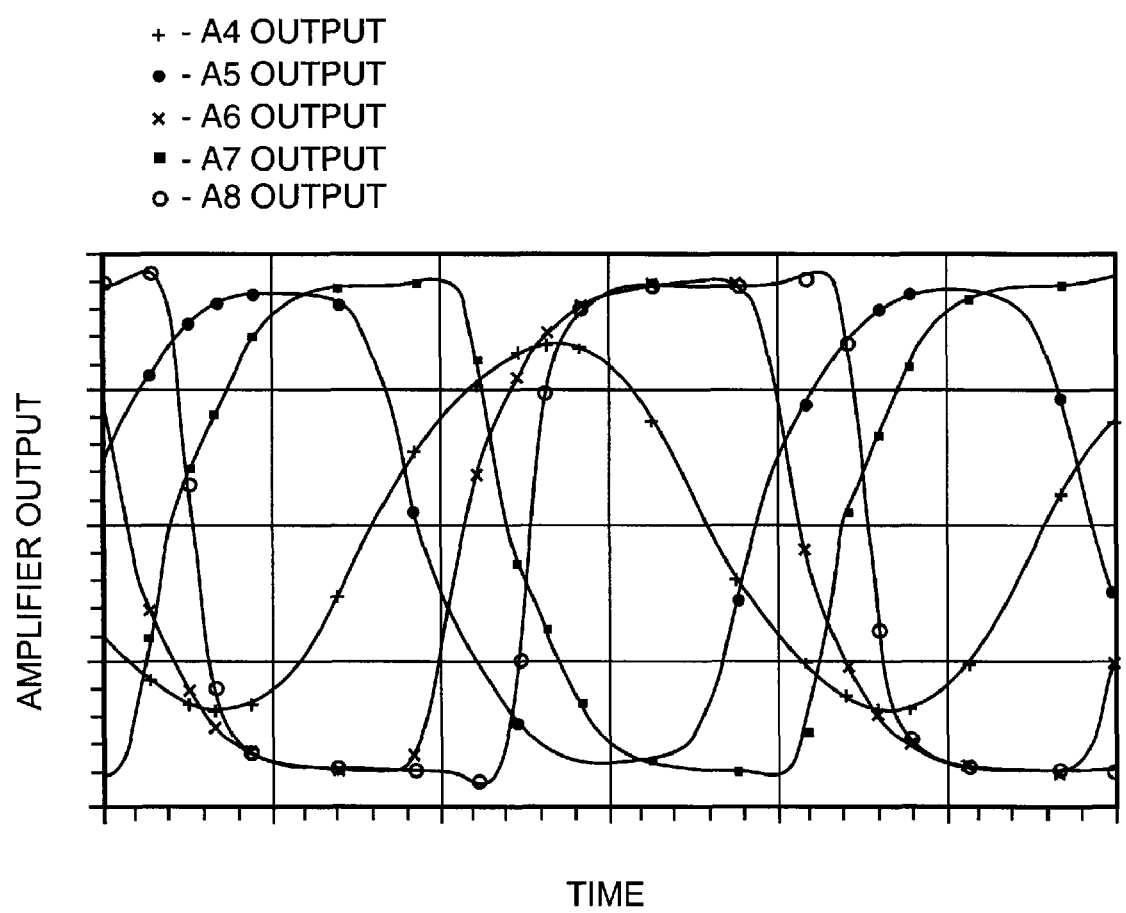

Each inverting amplifier 300 in the chain 110 has a gain $A_N$ and time delay $t_{dN}$. The inverting amplifiers 300 closer to the beginning of the chain 110 have a larger gain and longer delay while those toward the end of the chain 110 have a smaller gain and shorter delay as illustrated by FIGS. 4 and 5 (where A1 corresponds to the first inverting amplifier 300 in the chain 110, A2 the second inverting amplifier 300, etc.). FIGS. 4 and 5 illustrate amplifier output (y-axis) versus time (x-axis) for eight inverting amplifiers 300 coupled in a chain 110. However, any suitable number of the inverting amplifiers 300 may be used. How to determine the minimum number of inverting amplifiers 300 needed in the chain 110 is discussed later herein. FIG. 4 shows the RF input signal ($V_{RF}$) in differential form and the outputs of the first three amplifiers (A1-A3) in the chain 110 while FIG. 5 shows the outputs of the last five amplifiers (A4-A8) in the chain 110.

When the RF input signal increases in amplitude, the total time delay of the amplifier chain 110 decreases as more amplifiers 300 become saturated. The opposite occurs when the RF input signal decreases in amplitude. At least the last amplifier (A8) in the chain 110 operates in saturation for all non-negligible voltage levels of the RF input signal, ensuring that the passive mixer 130 rectifies the input signal over a wide range of frequencies and amplitudes. According to this embodiment, the differential output Vout+/Vout− for the pair of CMOS inverters P1/N1 and P2/N2 included in the last amplifier 300 in the chain 110 saturates at the supply voltage so long as the differential input signal Vin+/Vin− has non-negligible amplitude. Neither CMOS inverter P1/N1 nor P2/N2 has a diode voltage drop limitation. Thus, the last inverting amplifier 300 in the chain 110 outputs a square wave signal effectively at the supply voltage (Vdd). Other types of inverting amplifiers may be used. In another embodiment, a p-channel, n-channel, or resistive load can be used as part of the amplifier 120 instead of the pair of CMOS inverters P1/N1 and P2/N2. Regardless, the amplifier chain 110 outputs a square wave signal having an amplitude much larger than that of the RF input signal and which is limited only by the supply voltage level (minus any marginal voltage drop at the output of the amplifier chain 110). The supply-limited square wave signal output by the amplifier chain 110 then drives the switching operation of the passive mixer 130, causing the mixer 130 to function as a signal rectifier.

Figure 6:
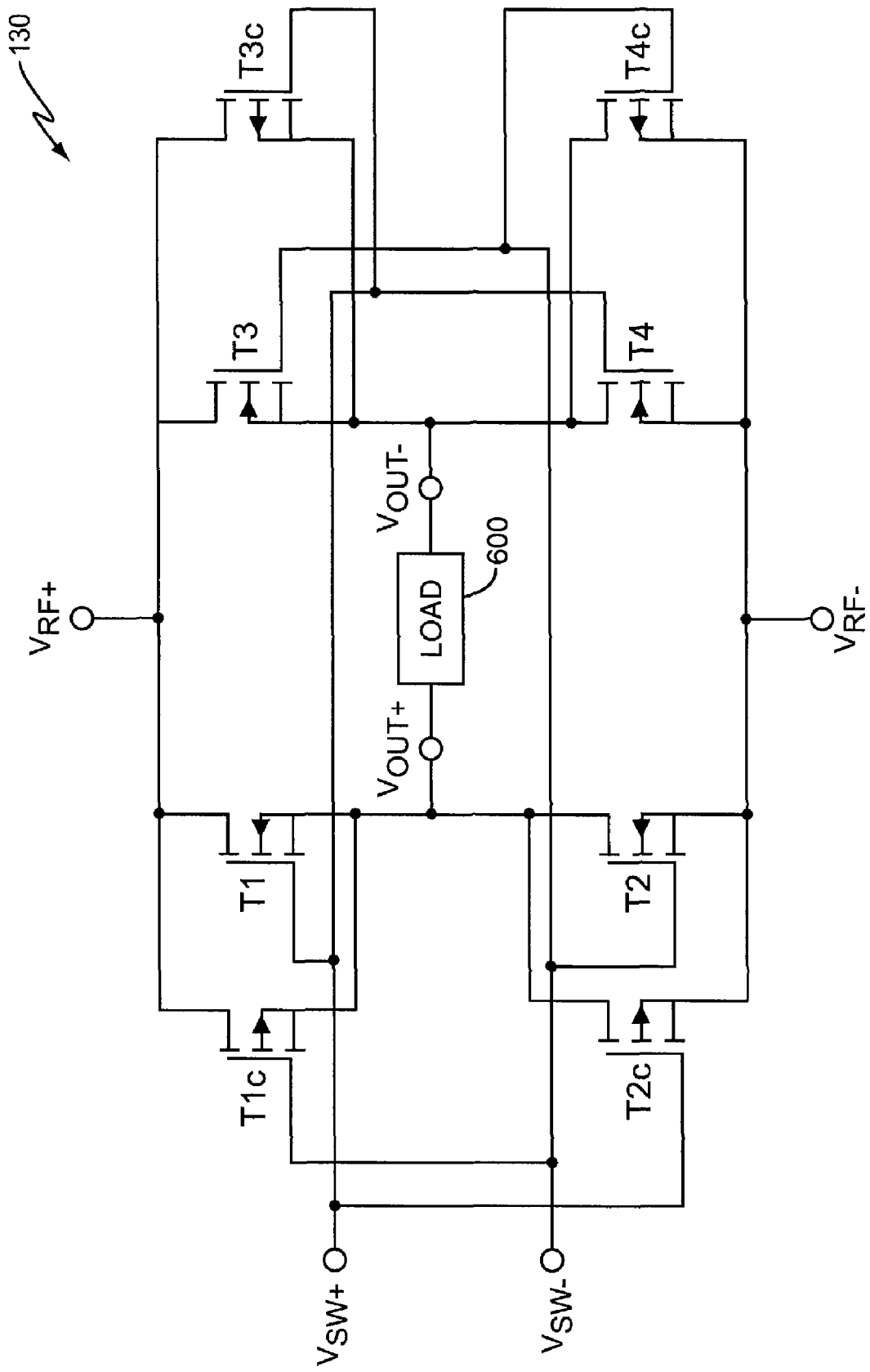
FIG. 6 is a block diagram of an embodiment of a passive mixer included in a power detector.

FIG. 6 illustrates an embodiment of the passive mixer 130. The passive mixer has four branches. The first branch includes nMOS transistor T1 and pMOS transistor T1c, the second branch includes nMOS transistor T4 and pMOS transistor T4c, the third branch includes nMOS transistor T3 and pMOS transistor T3c and the fourth branch includes nMOS transistor T2 and pMOS transistor T2c. In another embodiment, the pMOS transistors T1c-T4c are omitted. In either embodiment, the input signals to the passive mixer 130 are differential. During operation, the differential RF input signal ($V_{RF+}/V_{RF-}$) is switchably coupled to a load 600 in a first configuration when the differential supply-limited RF square wave signal ($V_{SW+}/V_{SW-}$) is of a first polarity, e.g., $V_{SW+}$ is positive and $V_{SW-}$ is negative. The configuration of coupling the differential RF input signal ($V_{RF+}/V_{RF-}$) to the load 600 is reversed when the supply-limited RF square wave signal changes polarity. Changing the configuration of coupling the differential RF input signal ($V_{RF+}/V_{RF-}$) to the load 600 in this way enables the passive mixer 130 to rectify the RF input signal in response to the supply-limited RF square wave signal, allowing the mixer output to monotonically track changes in the RF input signal.

In more detail, the first branch of the passive mixer 130 couples a first signal component ($V_{RF+}$) of the differential RF input signal to a first node ($V_{OUT+}$) of the load 600 when a first signal component ($V_{SW+}$) of the differential supply-limited RF square wave signal is positive supply-limited. Particularly, nMOS transistor T1 couples $V_{RF+}$ to $V_{OUT+}$. The complimentary signal component ($V_{SW-}$) of the differential supply-limited RF square wave signal actuates pMOS transistor T1c of the first branch when T1c is provided. In response, pMOS transistor T1c also couples $V_{RF+}$ to $V_{OUT+}$. The second branch of the mixer 130 couples the complimentary signal component ($V_{RF-}$) of the differential RF input signal to a second node ($V_{OUT-}$) of the load 600 when $V_{SW+}$ is positive supply-limited. Particularly, nMOS transistor T4 couples $V_{RF-}$ to $V_{OUT-}$. In addition, $V_{SW-}$ actuates pMOS transistor T4c of the second branch when T4c is provided. In response, pMOS transistor T4c also couples $V_{RF-}$ to $V_{OUT-}$. The third and fourth branches of the mixer 130 are switched off or otherwise deactivated when the differential supply-limited RF square wave signal is of the first polarity as described above.

The configuration of coupling the differential RF input signal ($V_{RF+}/V_{RF-}$) to the load is reversed when the differential supply-limited RF square wave signal changes polarity. That is, the third branch of the passive mixer 130 couples $V_{RF+}$ to $V_{OUT-}$ instead of $V_{OUT+}$ when $V_{SW+}$ is negative supply-limited and $V_{SW-}$ is positive supply-limited. The fourth branch of the passive mixer 130 similarly couples $V_{RF-}$ to $V_{OUT+}$. The first and second branches of the mixer 130 are switched off or otherwise deactivated when the differential supply-limited RF square wave signal is of the second polarity. Operating the passive mixer 130 this way yields a rectified signal at the mixer output that monotonically tracks changes in the RF input signal in response to the supply-limited RF square wave signal.

The magnitude, shape and delay of the supply-limited RF square wave signal input to the passive mixer 130 from the amplifier chain 110 depend on the number of amplifiers 120 included in the chain 110. As mentioned above, a certain number of amplifiers 120 are needed to ensure that at least the last amplifier 120 in the chain 110 operates in saturation for each non-negligible amplitude level of the RF input signal. Also, one or more additional amplifiers 120 may be needed to prevent a 90° phase difference between the RF input signal and the supply-limited RF square wave signal, ensuring proper mixer operation (i.e., as a signal rectifier).

Figure 7:
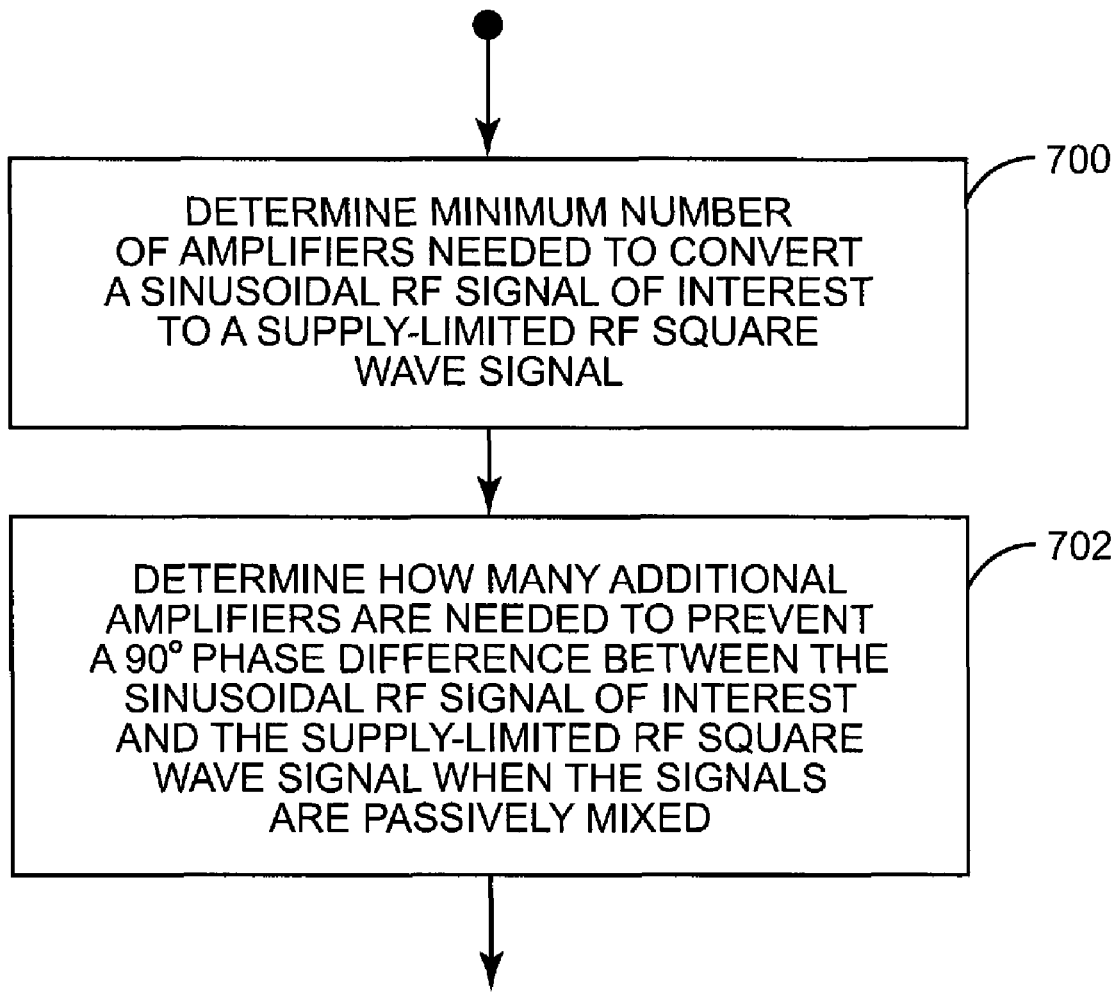
FIG. 7 is a flow diagram of an embodiment of program logic for determining how many amplifier stages are included in an amplifier chain of a power detector.

FIG. 7 illustrates an embodiment of a method for determining how many amplifier stages should be included in the power detector 100. The method involves determining the minimum number of amplifiers 120 needed to convert the RF signal of interest to a supply-limited RF square wave signal (Step 700). The minimum number of amplifiers 120 included in the amplifier chain 110 is a function of the total time delay of the chain 110. The total time delay of the amplifier chain 110 in turn depends on the amplitude and operating frequency of the RF input signal. This is so because the number of amplifiers 120 operating in saturation changes as a function of the amplitude and operating frequency of the RF input signal. With this in mind, one embodiment for determining the minimum number of amplifiers 120 to be included in the amplifier chain 110 involves calculating:

$$E = V_o A^m \quad (5)$$

where m can be solved according to:

$$m = \frac{\log E - \log V_o}{\log A_0 - \log \sqrt{1 + \left(\frac{f}{f_0}\right)^2}} \quad (6)$$

and m represents the number of non-saturated amplifiers 120, E represents supply voltage, $V_o$ represents the amplitude of the RF input signal of interest, $A_0$ represents a DC gain factor for each non-saturated amplifier 120, $f_0$ represents an upper frequency limit of the non-saturated amplifiers 120 and f represents the frequency of the RF input signal of interest.

The gain A for the amplifiers 120 not operating in saturation can be estimated as given by:

$$A = A_0 \frac{(-1)}{1 + j\frac{f}{f_0}} \quad (7)$$

Equation (7) can be expressed in polar form using magnitude and phase as given by:

$$A = r[j\cos(\Theta_A) + \sin(\Theta_A)] \quad (8)$$

$$r = \frac{A_0}{\sqrt{1 + \left(\frac{f}{f_0}\right)^2}}, \quad (9)$$

$$\cos(\Theta_A) = \frac{\frac{f}{f_0}}{\sqrt{1 + \left(\frac{f}{f_0}\right)^2}}, \quad (10)$$

$$\sin(\Theta_A) = \frac{-1}{\sqrt{1 + \left(\frac{f}{f_0}\right)^2}} \quad (11)$$

and $\Theta_A$ represents the phase shift attributable to each non-saturated amplifier 120. The phase shift is related to a delay time $\tau_1$ for each non-saturated amplifier 120 as given by:

$$\Theta_A = 2\pi f \tau_1 \quad (12)$$

$$\tau_1 = \frac{\arctan\frac{f}{f_0}}{2\pi f} \quad (13)$$

Each amplifier 120 operating in saturation effectively has no gain. In addition, the saturated amplifiers 120 can be characterized by a constant, frequency independent time delay $\tau_2$. From here, the total delay of the amplifier chain 110 can be calculated as given by:

$$\tau_{chain} = m\tau_1 + (n-m)\tau_2 \quad (14)$$

where m represents the number of non-saturated amplifiers 120 in the chain 110 and n represents the total number of all amplifiers 120. Substituting equation (6) into equation (14) yields:

$$\tau_{chain} = \frac{\log E - \log V_o}{\log A_0 - \log\sqrt{1 + \left(\frac{f}{f_0}\right)^2}}\left(\frac{\arctan\frac{f}{f_0}}{2\pi f} - \tau_2\right) + n\tau_2 \quad (15)$$

Accordingly, the total phase delay between the RF signal and supply-limited square wave signal inputs to the passive mixer 120 is not relevant. Instead, the variation in phase delay caused by the amplitude and frequency of the RF input signal will determine whether additional amplifiers 120 are needed to avoid the 90° phase condition. The minimum and maximum input voltage amplitude and operating frequency of the RF input signal can be characterized, yielding a shape with four sides in the complex plane. One or more additional amplifiers 120 are included in the chain 110 when the total time delay is expected to cause a 90° phase difference between the RF signal of interest and the supply-limited RF square wave signal when the signals are passively mixed (Step 702).

Figure 8:
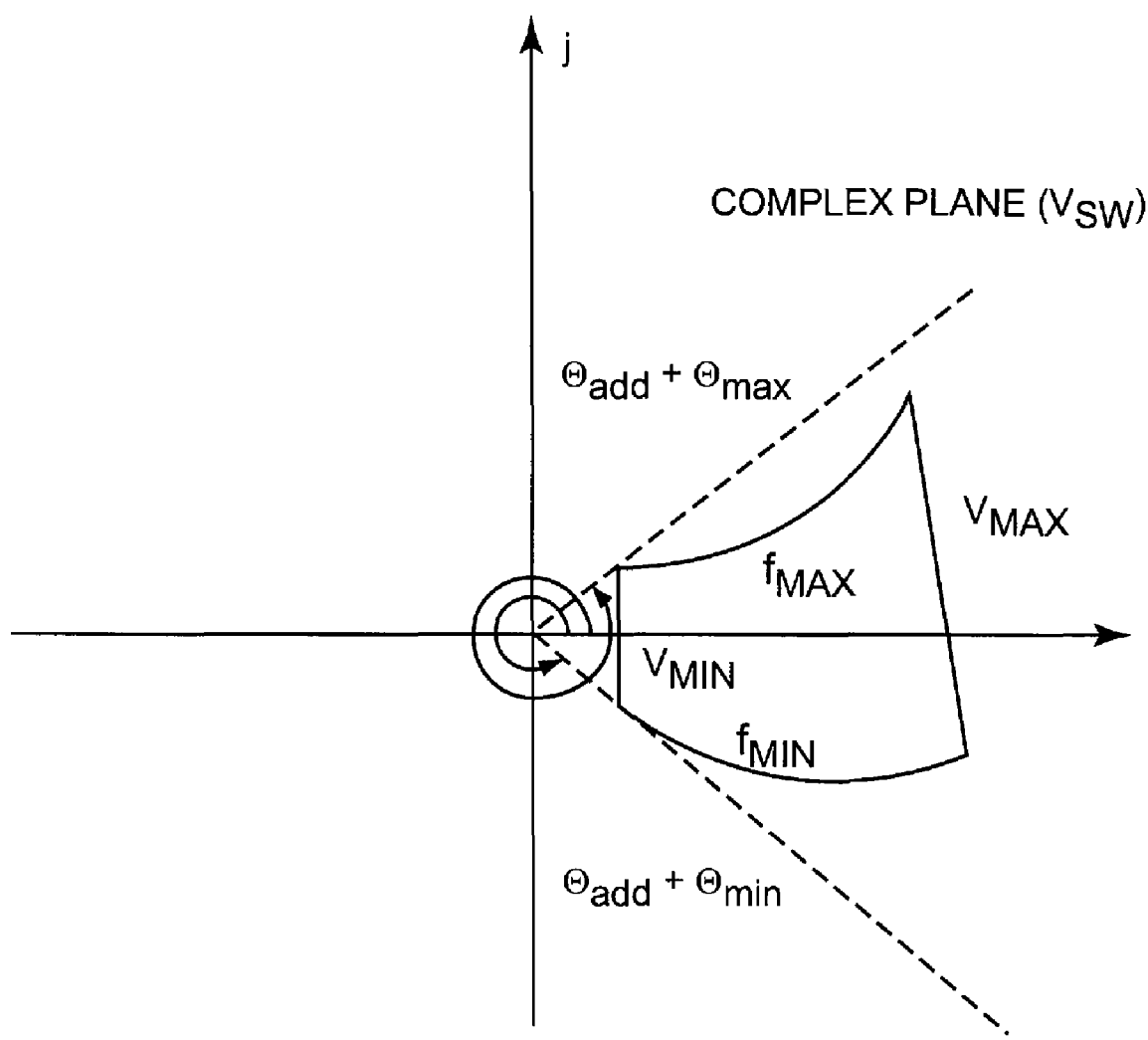
FIG. 8 is a plot diagram showing the output of a power detector amplifier chain in the complex plane.

According to one embodiment, enough additional amplifiers 120 are provided such that the phase shift of the output from the chain 110 is centered around n*180° and also avoids the 90° phase condition for all non-negligible frequencies and amplitudes of the RF signal of interest as shown in FIG. 8 (where n is an integer). In FIG. 8, $\Theta_{max}$ represents the maximum phase shift of the amplifier chain 110 before time delay adjustments are made to the chain while $\Theta_{min}$ represents the minimum phase shift. $\Theta_{max}$ and $\Theta_{min}$ are a function of the minimum and maximum voltage (Vmin, Vmax) and frequency (fmin, fmax) of the RF input signal as described above. In FIG. 8, $\Theta_{add}$ represents the phase shift adjustment made by adding one or more additional amplifiers 120 to the chain 110 for avoiding the adverse 90° phase condition. Sensitivities to CMOS process variations can also be modeled and accounted for accordingly. Regardless, accounting for the frequency and amplitude of the RF signal of interest ensures that the passive mixer 130 operates as a rectifier over a broad operating range.

With the above range of variations and applications in mind, it should be understood that the present invention is not limited by the foregoing description, nor is it limited by the accompanying drawings. Instead, the present invention is limited only by the following claims, and their legal equivalents.

What is claimed is:

1. A method of generating a rectified signal for power detection, comprising:
    generating a supply-limited radio frequency (RF) square wave signal from an RF input signal; and
    passively mixing the supply-limited RF square wave signal with the RF input signal to generate a rectified output signal that tracks the amplitude of the RF input signal.

2. The method of claim 1, wherein generating a supply-limited RF square wave signal from an RF input signal comprises:
    applying the RF input signal to a chain of amplifiers; and
    operating at least one of the amplifiers at the end of the chain in saturation for each non-negligible amplitude level of the RF input signal.

3. The method of claim 2, wherein operating at least one of the amplifiers at the end of the chain in saturation for each non-negligible amplitude level of the RF input signal comprises:
    inputting a differential signal to a pair of CMOS inverters coupled between a power supply and a bias device in a differential amplifier configuration; and
    outputting a differential signal from the pair of CMOS inverters that is saturated at the supply voltage while the differential signal has non-negligible amplitude.

4. The method of claim 2, comprising preventing the rectified output signal from having negligible amplitude when the RF input signal has non-negligible amplitude.

5. The method of claim 4, wherein preventing the rectified output signal from having negligible amplitude when the RF input signal has non-negligible amplitude comprises coupling a sufficient number of inverting amplifiers together in the chain to prevent a 90° phase difference between the RF input signal and the supply-limited RF square wave signal.

6. The method of claim 5, wherein coupling a sufficient number of inverting amplifiers together in the chain to prevent a 90° phase difference between the RF input signal and the supply-limited RF square wave signal comprises coupling a sufficient number of the inverting amplifiers together in the chain such that the total phase shift caused by the chain of amplifiers is centered around n*180° and also avoids the 90° phase difference, where n is an integer.

7. The method of claim 1, wherein passively mixing the supply-limited RF square wave signal with the RF input signal to generate the rectified output signal comprises:
    switchably coupling the RF input signal to a load in a first configuration when the supply-limited RF square wave signal is of a first polarity; and
    reversing the configuration when the supply-limited RF square wave signal changes polarity.

8. The method of claim 1, comprising filtering the rectified output signal to yield a DC output voltage that tracks the amplitude of the RF input signal.

9. A power detector, comprising:
    a chain of amplifiers configured to convert a radio frequency (RF) input signal to a supply-limited RF square wave signal; and
    a passive mixer configured to passively mix the supply-limited RF square wave signal with the RF input signal and in response, generate a rectified output signal that tracks the amplitude of the RF input signal.

10. The power detector of claim 9, wherein at least one of the amplifiers at the end of the chain is configured to operate in saturation for each non-negligible amplitude level of the RF input signal.

11. The power detector of claim 10, wherein the at least one amplifier at the end of the chain comprises a pair of CMOS inverters coupled between a power supply and a bias device in a differential amplifier configuration, the pair of CMOS inverters configured to output a differential signal saturated at the supply voltage while a differential signal input to the pair of CMOS inverters has non-negligible amplitude.

12. The power detector of claim 9, wherein the chain of amplifiers comprises a sufficient number of inverting amplifiers to prevent a 90° phase difference between the RF input signal and the supply-limited RF square wave signal.

13. The power detector of claim 12, wherein the chain of amplifiers comprises a sufficient number of the inverting amplifiers such that the total phase shift caused by the chain of amplifiers is centered around n*180° and also avoids the 90° phase difference, where n is an integer.

14. The power detector of claim 9, wherein a minimum number of amplifiers included in the chain satisfies:

$$m = \frac{\log E - \log V_o}{\log A_0 - \log \sqrt{1 + \left(\frac{f}{f_0}\right)^2}},$$

where m represents the minimum number of amplifiers, E represents supply voltage, $V_o$ represents the amplitude of the RF input signal, $A_0$ represents a DC gain factor for each amplifier, $f_0$ represents an upper frequency limit of each amplifier and f represents the frequency of the RF input signal.

15. The power detector of claim 9, wherein at least some of the amplifiers included in the chain are capacitively-coupled.

16. The power detector of claim 9, wherein the passive mixer is configured to switchably couple the RF input signal to a load in a first configuration when the supply-limited RF square wave signal is of a first polarity and reverse the configuration when the supply-limited RF square wave signal changes polarity.

17. The power detector of claim 16, wherein the passive mixer comprises:
　　a first branch configured to couple a first signal input of the differential RF input signal to a first node of the load when a first signal component of the differential supply-limited RF square wave signal is positive;
　　a second branch configured to couple a second signal input of the differential RF input signal to a second node of the load when the first signal component of the differential supply-limited RF square wave signal is positive;
　　a third branch configured to couple the first signal input of the differential RF input signal to the second node of the load when the second signal component of the differential supply-limited RF square wave signal is positive; and
　　a fourth branch configured to couple the second signal input of the differential RF input signal to the first node of the load when the second signal component of the differential supply-limited RF square wave signal is positive.

18. The power detector of claim 9, further comprising a filter configured to convert the rectified output signal to a DC output voltage.

* * * * *